United States Patent [19]

Bristowe et al.

[11] Patent Number: 4,757,120
[45] Date of Patent: Jul. 12, 1988

[54] POLYIMIDE/AROMATIC SULFONE RESIN BLENDS AND PREPEGS COATED THEREWITH

[75] Inventors: William W. Bristowe; Hong C. Kim, both of Wilmington, Del.

[73] Assignee: ICI Americas Inc., Wilmington, Del.

[21] Appl. No.: 914,772

[22] Filed: Oct. 3, 1986

[51] Int. Cl.⁴ .................... C08L 79/08; C08L 81/06
[52] U.S. Cl. ................................. 525/534; 525/535; 525/906; 525/907; 525/925; 525/540
[58] Field of Search ............ 525/524, 535, 906, 907, 525/925, 534, 540

[56] References Cited

U.S. PATENT DOCUMENTS 4,447,581  5/1984  Quella et al. ................ 525/535
4,562,231 12/1985  Dean ........................... 525/535

*Primary Examiner*—Allan M. Lieberman

[57] ABSTRACT

Polyimide polymers which are reaction products of active methylene compounds and N,N'-bismaleimide derivatives are improved by incorporating them with 2 to 15% by weight of a polyethersulfone polymer. The polymer blend is useful in producing films, moldings, prepegs, laminates and filled composites which are particularly useful in structural components which have stability at high temperatures.

4 Claims, No Drawings

POLYIMIDE/AROMATIC SULFONE RESIN BLENDS AND PREPEGS COATED THEREWITH

This invention relates to a novel resin blend for use in structural composites and particularly to blends of aromatic polysulfone polymer resins with particular types of polyimide prepolymer resin which are reaction products of bismaleimide with active methylene compounds. These compositions are used to make high performance molding powders, molded articles, prepregs and especially reinforced laminates.

Fiber reinforced composites have found increasing use as a replacement for metal and other structural materials especially in the automotive and aerospace industries due to their high strength and low weight. Epoxy polymers have been employed as matrix resins generally used in high performance composites. Carbon fibers/epoxy composites are routinely used for secondary structural applications in contemporary aircraft. However, epoxy polymers typically exhibit poor strength at elevated temperatures after aging in humid environments, i.e. they exhibit depressed glass transition temperatures (Tg), especially after thermal cycling under very humid conditions.

Polyimide resins have been used to impregnate fiberglass cloth to form circuit boards which have excellent resistance to high temperatures, low thermal expansion and retain a high level of electrical resistivity. However, these boards are relatively expensive in comparison with similar circuit boards made from epoxy polymers. Circuit boards of epoxy impregnated fiberglass sheets are not resistant to high temperature degradation and have poor electrical properties and undergo higher level of thermal expansion in comparison with similar circuit boards of polyimide resin.

The compositions of this invention are derived from combinations of aromatic sulfone polymers and copolymers and a particular type of polyimide resin wherein the improved properties offered by each resin is emphasized while their disadvantages are minimized. The blends of the invention are useful in the manufacture of prepregs which comprise a web of a fibrous material coated or impregnated with the blend. Preferably the web consists of structural reinforcements such as carbon, graphite, boron, steel, aramid, silicon carbide or glass fibers and the like. Fiber reinforced compositions of the invention are particularly improved in flowability, i.e., they require relatively low molding pressures at temperatures of 177° C., are nonflammable, have low smoke and toxicity, have improved impact strength and moisture resistance, have thermal and mechanical stability.

The resin blends of the present invention comprise mixtures of two polymers one having a substantial amount of the repeating units of an arylene bond, an ether bond, and a sulfone bond and the other an ethylenically unsaturated polyimide prepolymer which is a reaction product of an active methylene compound and a bismaleimide. The blends consist of essentially 2-15 parts by weight of the aromatic sulfone polymer. Additional compatible resins may be included to improve specific physical properties.

TABLE OF STRUCTURES

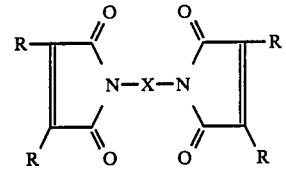

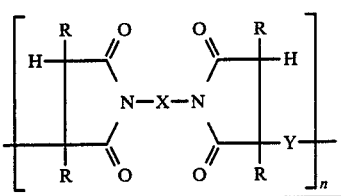

Polyimide Prepolymers

Polyimides which are reaction products of bismaleimides and active methylene compounds are a relatively new class of polyimides and have been described by Lu in U.S. Pat. No. 4,275,185. These polyimide prepolymers are derived from bismaleimides formed by reacting 2 mols of maleic anhydride with an organic diamine to provide a monomer having the general formula I (see table of structures) wherein X is a divalent organic radical and R is independently selected from the group consisting of H, F, Cl, Br, $CF_3$ and an alkyl group having 1-4 carbon atoms. The bismaleimide is then reacted with an active methylene compound having the general formula $R^1R^2CH_2$ wherein $R^1$ is a monovalent radical selected from the group consisting of $-CN$, $-NO_2$, $-CO-OR^3$, $-CONH_2$, $-CO_2H$, $-COC_6H_5$, $-CO-H$, $-CO-R^3$, $-CO-Cl$, $-SO_2C_6H_5$ wherein $R^3$ is an alkyl group having 1 to 4 carbon atoms and $R^2$ is a monovalent radical selected from the group consisting of $R^1$ and H, $-CH_3$, $-C_6H_5$, $-Cl$, $-F$ or $-C_6H_4Z$ where Z is $-H$, $-CH_3$, and lower alkyl, Cl, $-Br$ or $-F$. Prepolymers formed in this reaction have the general formula II wherein n is an integer and Y is $R^1R^2C=$. N,N'-Bismaleimides of formula I used in the reaction are well known in the prior art and may be conventionally prepared from maleic anhydride as described in U.S. Pat. No. 2,444,536. The N,N'-bismaleimide most useful are those wherein R is independently selected as previously described and wherein X is a divalent organic radical which may be an organic radical including aliphatic, aromatic hydrocarbon radicals such as arylene, alkylene, alkarylene and aralkylene, and lower alkylene substituted and halogenated derivatives thereof. Preferred bismaleimides for use in this invention are those wherein X contains from 1 to 20 carbon atoms. Illustrative examples of X include methylene, ethylene, propylene, butylene, hexamethylene, decamethylene, phenylene, bisphenylene, toluene, ditoluene, xylene, diphenylmethane, alkyl substituted diphenylmethane such as tetramethyldiphenylmethane, diphenylpropylene, diethlydiphenylmethane, naphthalene and alkyl derivatives thereof, methylene dicyclohexylene anthracenediol, sulfodiphenylene, oxybismethylenephenylene, carbonyldiphenylene, oxydiethylene, oxydiphenylene, chlorohexylmethylenetetrachloroparaphenylene, cyclohexylene and isophorone. A particularly preferred class of bismaleimides for the preparations of polyimide polymers having the best thermal stability are those wherein X contains an aromatic group of the general structure —C$_6$H$_4$—QC$_6$H$_4$— where Q is selected from the group consisting of —CH$_2$—, —O—, —SO$_2$— and —CO—.

The active methylene compound employed in making the polyimides are well known and have the formula R$^1$ R$^2$ CH$_2$ wherein R$^1$ and R$^2$ are as previously defined. The activated methylene hydrogens react with carbon carbon double bounds to form active methylene terminated or ethylenically unsaturation terminated polyimide prepolymers. Examples of activated methylene compounds which may be used to form the polybismaleimide prepolymers include: malononitrile, α-alkylaminoacetonitrile, phenylacetonitrile, α-carboxyacetonitrile, α-diphenylsulfonylacetonitrile, α-carboalkoxyacetonitrile, 1,4-bis(cyanomethyl)benzene, α-halocarbonylacetonitrile, α-chloroacetonitrile, nitroalkanes, acetylacetone, diethylmalonate, 2,4-pentandione, dialkylacetoacetate and dibenzoylmethane.

These polyimide prepolymers may be made by reacting the bismaleimide/active methylene compound at temperatures ranging from 0°–170° C. preferably 10°–120° C. neat or in solvent solution in the presence of catalysts. Phenolic solvents such as phenyl, o-cresol, m-cresol, p-cresol, xylenols, chlorophenols, 2-bromo-4-methylphenol and the like are useful. Polar solvents include such materials as dimethylformamide, dimethylacetamide, 1-methyl-2-pyrollidone, dimethylsulphoxide or cyclohexanone. Acid solvents such as formic acid, acetic acid, proprionic acid, sulphuric acid, hydrochloric, nitric or phosphoric acids may be employed.

Polymers of the active methylene compound/bismaleimide may be formed by reacting the respective ingredients in molar proportions either greater or less than 1:1. A bismaleimide/active methylene compound mol ratio of the range between 1:1 and 1:0.5 are preferred.

The following preparative examples serve as non-limiting illustrations of the types of polyimide copolymers which can be employed in the invention and unless otherwise indicated all proportions are on a weight basis.

Preparation A. 1433.4 g (4.0 mols) of N,N'-(methylene-di-p-phenylene)bismaleimide and 1800 ml of dimethylformamide are placed in a 5 liter three neck flask and heated to 70° C. When the solution is complete, 257.7 ml glacial acetic acid is added followed by 185 g (2.8 mols) of malononitrile which is washed into the flask with 87.9 ml of dimethylformamide. A brief exothermic reaction occurs until 98° C. temperature results. The solution is stirred to about 70° C. for 1.25 hours at which time the viscosity became about 6.0 poise as measured by an ICI Cone and Plate Viscometer. The polymer solution is then cooled. Polyimide is obtained by precipitating the resin with stirring into methylethylketone followed by filtering, washing with methylethylketone and drying. This material is hereinafter referred to as 10/7 bismaleimide/malononitrile resin or (10/7 resin).

Preparation B. According to the procedure outlined in Preparation A, bismaleimide is reacted with malononitrile in mol ratios of 10/3. This material hereinafter referred to as 10/3 bismaleimide/malanonitrile resin (10/3 resin).

Preparation C. According to a procedure outlined in Preparation A, bismaleimide is reacted with 2,4-pentandione in mol ratios of 10/7. This material is hereinafter referred to as 10/7 bismaleimide/pentandione resin (10/7PD resin).

Aromatic Sulfone Polymers. Polyarylethers containing sulfone groups are generally referred to as polysulfones or polyethersulfones (PES). The glass transition temperatures for these polysulfones are quite high for example 200° C. or higher and these polymers retain many of the mechanical properties with only slight deterioration up to temperatures close to the glass transition temperature. Surprisingly it has been found that addition of PES to the above described polyimides improves a combination of properties such as resin flow during molding, cure shrinkage (less shrinkage), transverse flexural strength and strain, impact resistance, and interlaminar fracture toughness. Such improvements are obtained when PES is blended with the above described polyimides in concentrations ranging 0.5–20% and a preferred 2–10% by weight based on the total resin solids.

Suitable aromatic polyethersulfone polymers useful in the preparation of the improved compression, autoclave and resin transfer moldable copolymer blend comprise a linear polymer containing three kinds of unit bonds consisting of an arylene bond, an ether bond and a sulfone bond. Representative examples of these aromatic polysulfone resins include those having a substantial amount of repeating units having the general formulas:

| | |
|---|---|
| (OArSO$_2$ArOArC(CH$_3$)$_2$Ar) | III |
| (OArSO$_2$Ar) | IV |
| (OArSO$_2$ArOAr) | V |
| (OArSO$_2$Ar—Ar—OAr—C(CH$_3$)$_2$Ar—) | VI |
| (OArSO$_2$ArOAr—Ar—) | VII |
| (OAr—SO$_2$ArOArCH$_2$Ar) | VIII |
| (O—Ar—SO$_2$—Ar—SO$_2$—Ar) | IX | wherein Ar is a divalent benzene ring in most instances but may be interpreted as including a biphenyl, tetraphenyl, naphthalene, indene or fluorene divalent residues and may be substituted with substituents which do not interfere with the preparation of the polyarylsulfone polymer. Substituents that are present can be halogen atoms, hydrocarbon groups, ether groups or thioether groups. It is generally preferred that at least some of the Ar groups contain two aromatic groups which are linked together through a nonaromatic linking group. Specifically it is preferred that at least some of the Ar groups have the general formula —Ar'—Y—Ar'— where each Ar', which may be the same or different is a substituted divalent aromatic hydrocarbon residue, —Y— is —O—, —S—, —SO$_2$—, —CO—, an optionally substituted divalent aliphatic hydrocarbon residue or a group —(Y'—Ar')$_m$—Y'— where each Y' may be the same or different and is —O—, —S—, —SO$_2$—, —CO— or an optionally substituted divalent aliphatic hydrocarbon residue and m is an integer. Preferred polyether sulfones are those having repeating units of the general formula:

—Ar'—Y"—Ar'—SO$_2$— wherein Y" is selected from —O— and —SO$_2$—. Preferred structures of such compounds are represented by formulas IV; V; VI; VII; VIII above which are commercially available under the trademark Victrex ®.

For many applications, the polymer composition of the present invention may be used with few if any additives other than stabilizers. However, other additives may be incorporated into the polymer composition. A wide range of additives have been proposed for use in polymer compositions and many of these additives may be incorporated into the polymer composition of the present invention and for convenience hereafter the term filled polymer composition will be used to mean the polymer composition of the present invention which also contains an additive. The filled polymer composition can include for example inorganic and organic fibers and fillers such as glass fiber, carbon fiber, nylon filaments, organic or inorganic fillers such as polytetrafluoroethylene, graphite, boron nitride, mica, talc, and vermiculite nucleating agents, and stabilizers for the various polymer components.

It is preferred that the total portion of additives when present is at least 0.1% and does not exceed 80% by weight of the filled polymer composition and especially that the proportion of additives does not exceed 70% by weight. The filled polymer composition can contain 5 to 30% by weight of boron nitride, or at least 20% by weight of short glass or carbon fiber, or 5 to 70% by weight of continuous glass or carbon fiber or a mixture of fluorine containing polymer, graphite and an organic or inorganic fiber filler wherein the total proportion of these additives is preferably at least 20% and not more than 80% by weight of the filled polymer composition. Of particular interest are sized fiberglass mats or graphite fiber mats or cloth which are coated with a substantial amount of the polymer composition of the invention to form prepregs which can be further shaped and laminated to one another to form multi-layered laminates having improved physical properties at high temperatures.

The polymer composition of the present invention may be made by admixture of the polymer components in a suitable mixing machine to effect blending for example by powder or melt blending. More specifically the two polymer components in the form of dry powders or granules can be mixed together using a suitable solids blending techniques such as tumble blending or a high speed mixer. The blend thus obtained may be extruded into a lace which is chopped to give granules. The granules can be used to produce shaped articles by the use of a suitable forming operation for example injection molding or extrusion to give a shaped article. Blending can also be achieved by forming a solvent solution of the polyimide and polyethersulfone and thereafter removing the solvent from the blend.

Prepregs can be stored in a controlled condition and then used to form a multiplicity of layers, shaped, compressed at pressures up to 20 MPa (megapascals) at temperatures of 100°-250° C. to form cured laminates. Prepregs containing less than 5% by weight of residual solvent can be laminated.

Filled polymer compositions may be obtained by mixing the additive or additives with the components of the polymer or with granules of the polymer composition.

The blended polymers of the invention may be formed into films, foils, or injection molded to form shaped articles, or compressed to form laminates. Films, foils, powder or granules of the polymer composition can be laminated with fiber material in the form of mats or cloths.

Filled polymer compositions containing fiber filler materials may be obtained by passing essentially continuous fiber, for example glass or carbon fiber through a melt of the polymer composition or a molten mixture containing the polymer composition. The product obtained is a fiber coated with the polymer composition. The coated fiber may be used alone or together with other materials for example a further quantity of the polymer composition to form a shaped article by the appropriate shaping method. Coated fiber materials in the form of continuous filament, mats or cloth may be coated by treating the fibrous material with a solution containing the polymer composition by soaking the cloth or passing the continuous filament through the solution and thereafter removing the solvent from the treated article.

Additional modifying polymers may be included with the composition of the invention. Thermosetting properties can be improved by the addition of polyepoxides, polyimides either saturated or unsaturated, polyamides, polycarbonates, arcylic polymers, styrenic polymers, or olefinic polymers.

The unfilled and filled polymer compositions have properties which make them suitable for high temperature applications where good solvent resistance is also desirable. The polymer compositions also have good electrical insulating characteristic and hence are useful for applications requiring such characteristics, in particularly, in combination with high temperature properties.

In a further application in which the electrical properties of the polymer composition are beneficial, shaped articles formed from the polymer composites or filled polymer composites can be used for the production of printed circuit boards since the polymer composites show good resistance to distortion by molten solder.

The following examples will serve to illustrate but not limit the improvements offered by the compositions of the invention. All proportions expressed are in parts by weight unless otherwise specified.

EXAMPLE 1

The amount of resin flash during molding which is an indication of resin flowability was measured on prepregs prepared from 10/7 bismaleimide/malononitrile polymer made according to Preparation A and Hercules AS4 continuous graphite fibers with and without PES (Victrex ®) addition. As shown in Table 1, the PES modified prepreg exhibited higher percentage of resin flash based on the total weight of the prepreg. This indicates that PES addition improves the flow of the polyimide during compression molding which in turn improves various physical and mechanical properties of advanced composites through formation of better fiber-matrix interface and/or a defect free composite structure.

TABLE 1

| Formulation | Component Weight (%) | Resin Flash Weight (%) |
|---|---|---|
| Prep. A/ | 33.0 | 0.13 |
| Graphite Fiber | 67.0 | |
| Prep. A | 31.35 | 0.69 |
| PES | 1.65 | |

TABLE 1-continued

| Formulation | Component Weight (%) | Resin Flash Weight (%) |
|---|---|---|
| Graphite Fiber | 67.0 | |

Note:
22 plies of the prepregs were molded at 230° C. for 20 min. with 2700 psi pressure.

EXAMPLE 2

In order to investigate the effect of PES (Victrex ®) addition on the cure shrinkage of 100% of Preparation A resin, castings were prepared with and without PES addition. As shown in Table 2, PES significantly reduces the cure shrinkage of Preparation A resin.

TABLE 2

| | Linear Cure Shrinkage (%) |
|---|---|
| 10/7 Resin (100%) | 1.57 |
| 10/7 Resin/15% PES | 1.10 |

Note:
Resin castings were prepared at 1000 psi by slowly heating the powder to 230° C. The cure time was 15 min.

The reduction of shrinkage achieved from the PES modified 10/7 resin casting was greater than the mathematical proportion of PES (15%). Since the resin castings were molded at 230° C. which is the glass transition temperature of PES, PES particles should expand to compensate the shrinkage caused by 10/7 resin polymerization at the molding temperature. Therefore, PES particles appear to act like low profile additives in sheet molding compounds.

EXAMPLE 3

In order to study the effect of PES addition on the transverse flexural properties of laminates with unidirectional fiber reinforcement, laminates were prepared from 10/3 resin and pre-stitched Orcoweb G-450 unidirectional graphite fibers with varying concentration of PES (Victrex ® 4100P-200). Transverse flexural tests were performed on 3" long, ½" wide, and 1/8" thick specimens with 2" supporting span length and 0.05"/min. cross head speed. As summarized in Table 3, improvement in transverse flexural strength and strain was achieved from PES addition.

TABLE 3

| Composition | Strength (10³ psi) | Modulus (10⁶ psi) | Strain (%) |
|---|---|---|---|
| 10/3 Resin + 0% PES | 5.5 | 0.98 | 0.50 |
| 10/3 Resin + 5% PES | 3.7 | 0.76 | 0.58 |
| 10/3 Resin + 10% PES | 6.3 | 1.00 | 0.59 |

Note:
20 plies of the prepregs were molded at 2,778 psi by slow heating to 177° C. with 1 hr. cure time.

EXAMPLE 4

In order to investigate the effect of PES addition on the impact resistance of composites, laminates were prepared from 10/3 resin and T300-8H (8 harness satin woven graphite cloth) with and without PES addition. Impact tests were performed on an instrumented falling dart impactor with specimens of 3"×3" size. As shown in Table 4, marked improvement in crack initiation energy was achieved from PES addition. Resistance of a material to crack initiation is more important than resistance to total fracture which includes crack propagation energy, because in many practical applications the definition of failure is crack initiation rather than catastrophic total fracture.

TABLE 4

| Composition | Falling Dart Impact Energy (J) | |
|---|---|---|
| | Crack Initiation | Total |
| 10/3 Resin + Graphite Cloth | 4.78 | 22.33 |
| 10/3 Resin + 10% PES + Graphite Cloth | 7.46 | 26.05 |

Note:
The total resin solids content in the prepregs was 36% by weight. 10 plies of the prepregs were molded at 2,778 psi by slow heating to 177° C. with 1 hr. cure time.

EXAMPLE 5

In order to study the effect of PES addition on the interlaminar fracture toughness of polyimide composites, several laminates were prepared from 10/7 resin and E7781 8 harness woven glass cloth with varying concentration of PES (Victrex ®—300P). Interlaminar fracture toughness tests were conducted on ½" wide, 6" long, and ¼" thick straight sided double cantilever beams with 0.05"/min. cross head speed. As noted in Table 5, significant increase in interlaminar fracture toughness ($G_{IC}$) was achieved from PES addition.

TABLE 5

| Composition | Interlaminar Fracture Toughness (J/m²) |
|---|---|
| 10/7 Resin + 0% PES | 715 |
| 10/7 Resin + 2% PES | 1081 |
| 10/7 Resin + 5% PES | 943 |
| 10/7 Resin + 10% PES | 1106 |

Note:
The weight fraction of E7781 woven glass cloth in the laminates was 65%. 28 plies of the prepregs were molded at 230° C. for 10 min. with 2,700 psi pressure.

EXAMPLE 6

In order to demonstrate the effect of PES addition on the water absorption property of printed wiring board laminates, E7628 glass cloth reinforced laminates were prepared from 10/7 bismaleimide/pentanedione resin prepared according to the Preparation C and the addition of 5% by weight of PES (4100 p, 17,600 M.W., 217° C. Tg). The level of water absorption of the PES modified glass laminates was considerably lower than that of the unmodified laminates. The water absorption level of the PES modified glass laminates was low enough to meet the military spec for polyimide printed wiring boards.

EXAMPLE 7

The toughening effects of PES in brittle thermosetting resins was confirmed in a polyimide copolymer prepared from bismaleimide and dibenzoyl methane. The toughness of the PES modified bismaleimide/dibenzoyl methane polyimide was noted to be far superior to that of the unmodified bismaleimide/dibenzoyl methane polyimide.

What is claimed is:

1. A resin composition comprising an ethylenically unsaturated polyimide prepolymer which is the reaction product of an active methylene compound having the formula $R^1R^2CH_2$ wherein $R^1$ is a monovalent radical selected from the group consisting of —CN, —NO$_2$, —CO—OR$^3$, —CONH$_2$, —CO$_2$H, —CO—H, —COC$_6$H$_5$, CO—R$^3$, —CO—Cl, —SO$_2$—C$_6$H$_5$, wherein R$^3$ is an alkyl group having one to four carbon atoms and $R^2$ is a monovalent radical selected from the group consisting of $R^1$ and —H, —CH₃, —C₆H₅, —Cl, —F, or —C₆H₄Z wherein Z is —H, —CH₃, a lower alkyl having 1–4 carbon atoms —Cl, —Br, or —F, with a bismaleimide compound of Formula I wherein X is a divalent organic radical and R is independently selected from the group consisting of —H, —F, —Cl, —Br, CF₃ and an alkyl having 1–4 carbon atoms, said prepolymer blended with 2–15 parts by weight of polyether sulfone resin which comprises a substantial amount of repeating units of an arylene bond, an ether bond and a sulfone bond wherein Formula I is:

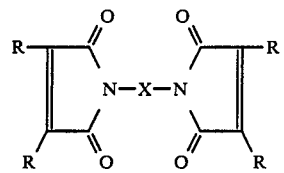

2. A composition of claim 1 wherein said polyimide prepolymer is a reaction product of a bismaleimide with an active methylene compound selected from the group consisting of malononitrile, 2,4-pentanedione, and dibenzoylmethane.

3. A composition of claim 1 where X in said polyimide is selected from the group consisting of phenylene, alkylene, and —C₆H₄—Q—C₆H₄—, and Q is selected from the group consisting of —CH₂—, —O—, —SO₂ and —CO—.

4. A polymer composition of claim 1 wherein said polyethersulfone is one having repeating units of the formula —OArSO₂Ar—; —OArSO₂ArOAr—; and —OArSO₂ArArOArC(CH₃)₂Ar—; where Ar is a phenylene group.

* * * * *